United States Patent
Crocker

(10) Patent No.: US 9,563,340 B2
(45) Date of Patent: Feb. 7, 2017

(54) OBJECT MANIPULATOR AND METHOD OF OBJECT MANIPULATION

(71) Applicant: Gary Arnold Crocker, San Diego, CA (US)

(72) Inventor: Gary Arnold Crocker, San Diego, CA (US)

(73) Assignee: IntegrityWare, Inc., San Diego, CA (US)

( * ) Notice: Subject to any disclaimer, the term of this patent is extended or adjusted under 35 U.S.C. 154(b) by 200 days.

(21) Appl. No.: 14/201,829

(22) Filed: Mar. 8, 2014

(65) Prior Publication Data

US 2015/0253957 A1    Sep. 10, 2015

(51) Int. Cl.
*G06F 3/048*    (2013.01)
*G06F 3/0484*    (2013.01)
*G06F 17/50*    (2006.01)

(52) U.S. Cl.
CPC ....... *G06F 3/04842* (2013.01); *G06F 3/04845* (2013.01); *G06F 17/50* (2013.01)

(58) Field of Classification Search
CPC ......... G06T 15/00–15/80; G06T 19/00–19/20; G06T 2219/00–2219/2024; G06F 3/04802–3/0486;G06F 17/50; G06F 2217/04; G06F 2203/04802–2203/04808
See application file for complete search history.

(56) References Cited

U.S. PATENT DOCUMENTS

| | | | |
|---|---|---|---|
| 6,448,964 B1* | 9/2002 | Isaacs | G06F 3/0362 345/419 |
| 2011/0066963 A1* | 3/2011 | Schrag | G06F 3/04815 715/769 |
| 2014/0129990 A1* | 5/2014 | Xin | G06K 9/6201 715/849 |

* cited by examiner

*Primary Examiner* — Claudia Dragoescu

(57) ABSTRACT

A method and system for graphic manipulation is provided. The graphic manipulation can be performed using a graphic manipulator that can have three mutually perpendicular axes indicators and a plurality of action icons associated with one or more of the axes. The graphic manipulator can be oriented with respect to axes of the object being manipulated. Based on the specific orientation of the graphic manipulator, and based on the selection of portions of the manipulated object some of the axis indicators and the plurality of action icons can be displayed and/or not displayed.

14 Claims, 7 Drawing Sheets

OBJECT MANIPULATOR AND METHOD OF OBJECT MANIPULATION

BACKGROUND OF THE INVENTION

This disclosure relates in general, but not by way of limitation, to graphic manipulation.

During the graphical design process, objects are created and modified. In some systems, an object is modified by selecting portion of the object and modifying it by, for example, moving it, rotating it, or resizing it. In some systems, a manipulator is used to modify the object. The manipulator may have graphical indicators representing options for modifying the selected object.

BRIEF SUMMARY OF THE INVENTION

Some embodiments relate to a method of providing a graphic manipulating tool. The method can include, for example, generating a graphic manipulator that can include a first axis indicator that can be, for example, an axis movement action icon that can control the position of an object associated with the graphic manipulator along the axis identified by the axis indicator, a second axis indicator extending perpendicular to the first axis indicator, a first plane extending through the first and second axis indicators, a scale-in-one-axis action icon that can control the size of the object along the axis identified by the first axis indicator, a rotate action icon that can control the rotation of the object about the axis identified by the first indicator, a plane scale action icon that can control the size of the object parallel to the plane defined by the first and second axis indicators, and a plane move action icon that can control the position of the object parallel to the plane defined by the first and second axis indicators. The method can further include, for example, generating an image including the graphic manipulator and the object, and displaying the image of the graphic manipulator and the object.

In some embodiments of the method, the graphic manipulator can further include a third axis indicator extending perpendicular to the first and second axis indicators, a second plane extending through the first and third axis indicators, and a third plane extending through the second and third axis indicators, and in some embodiments, the graphic manipulator can further include a scale all action icon located at the junction of the three axis indicators and that controls the size of the object associated with the graphic manipulator along the three axes identified by the first, second, and third axis indicators. In some embodiments, the graphic manipulator can include an axis movement action icon, a scale-in-one-axis action icon, and a rotate action icon associated with the second axis indicator, and in some embodiments, the graphic manipulator can include an axis movement action icon, a scale-in-one-axis action icon, and a rotate action icon associated with the third axis indicator.

In some embodiments of the method, the image can be generated such that the pairing of the image plane and each of the first, second, and third axis indicators subtends a non-perpendicular angle.

Some embodiments relate to a method of displaying a graphic manipulator. The method can include, for example, displaying a first image in an image plane, which first image can include an object and a graphic manipulator in a first position. In some embodiments, the graphic manipulator can include a first axis indicator, a second axis indicator, and a third axis indicator, all of which axis indicators can be, for example, mutually perpendicular. In some embodiments, the first, second, and third axis indicators each subtend a non-perpendicular angle with the image plane. The method can further include receiving a request via the graphic manipulator to move the object to a second position, which second position can result in the first axis indicator being perpendicular to the image plane of the image. The method can further include displaying a second image in the image plane, the second image including the object and the graphic manipulator in the second position. In some embodiments the first axis indicator is not displayed in the second image.

In some embodiments, the method can further include receiving a request via the graphic manipulator to move the object to a third position. In some embodiments, the third axis indicator is perpendicular to the image plane of the image when the graphic manipulator and the object are in the third position. The method can further include displaying a third image, the third image including the object and the graphic manipulator in the third position. In some embodiments in which the third axis indicator is perpendicular to the image plane in the third image, the third axis indicator is not displayed.

In some embodiments, the graphic manipulator can further include a scale-in-one-axis action icon that can control the size of the object along the axis identified by the first axis indicator, a rotate action icon that can control the rotation of the object about the axis identified by the first indicator, a plane scale action icon that can control the size of the object parallel to the plane defined by the first and second axis indicators, and a plane move action icon that can control the position of the object parallel to the plane defined by the first and second axis indicators. In some embodiments, one of the scale-in-one-axis action icon, the plane scale action icon, and the plane move action icon is not displayed in the second image, and in some embodiments, the rotate action icon is not displayed in the third image.

In some embodiments, the method can further include receiving a request to manipulate the object via the selection of one of the following action icons: the scale-in-one-axis action icon, the rotate action icon, the plane scale action icon, and the plane move action icon. The method can further include displaying a fourth image in which the appearance of the selected action icon is altered to provide a visual indication of the selection.

Some embodiments relate to a method of generating a graphic manipulator. The method can include accessing data defining an image of an object configured to be displayed in a viewing plane. The object includes a first axis extending from an origin in a first positive direction and in a first negative direction, a second axis extending from the origin in a second positive direction and in a second negative direction, and a third axis extending from the origin in a third positive direction and a third negative direction, where the axes are mutually perpendicular. The method also includes accessing data defining an image of a graphic manipulator configured to be displayed with the object in the viewing plane, where the graphic manipulator includes a first axis indicator extending parallel to the first axis, a second axis indicator extending parallel to the second axis, and a third axis indicator extending parallel to the third axis. The axis indicators are configured to appear to extend out from the viewing plane regardless of the orientation of their associated axes. The method also includes displaying the image of the object and the image of the graphic manipulator based on the object data and the graphic manipulator data.

In some embodiments, the graphic manipulator further comprises a plurality of action icons, each associated with one or more of the axis indicators, and wherein the action icons are configured to control at least one of the size, the orientation, and the shape of the object. In some embodiments, the image further comprises a control mesh.

In some embodiments, the method further includes receiving a selection of a portion of the object or the control mesh, receiving request to alter at least one of the size, the orientation, and the shape of the object via one of the action icons, and displaying an image of the object altered according to the request in the viewing plane. In some embodiments, the appearance of the one action icon is altered to provide a visual indication of a selection of the one action icon.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

The present disclosure is described in conjunction with the appended figures.

In the appended figures, similar components and/or features may have the same reference label. Where the reference label is used in the specification, the description is applicable to any one of the similar components having the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

An object, also referred to herein as a graphical object, can be displayed to a user on, for example, a display device such as a monitor, screen, a projector, and a television, and/or projected for viewing by the user. The display of this object can be controlled by a computer and/or processor that controls the display of the object according to stored instructions that can be, for example, stored in memory associated with the processor and/or communicatingly connected with the processor, and/or inputs received from a user. The processor can comprise a microprocessor, such as a microprocessor from Intel® or Advanced Micro Devices, Inc.®, or the like.

To facilitate user control of the display of the object and/or the user manipulation of the object, a graphic manipulator can be provided. The graphic manipulator can have features that allow the user to perform specific and controllable manipulations of the object. In some embodiments the display of the graphic manipulator and/or features that allow the user to perform specific and controllable manipulations on the object can vary based on the displayed view of the graphic manipulator and/or the selected portion and/or feature of the object that is being manipulated.

Graphic Manipulator

Figure 1:
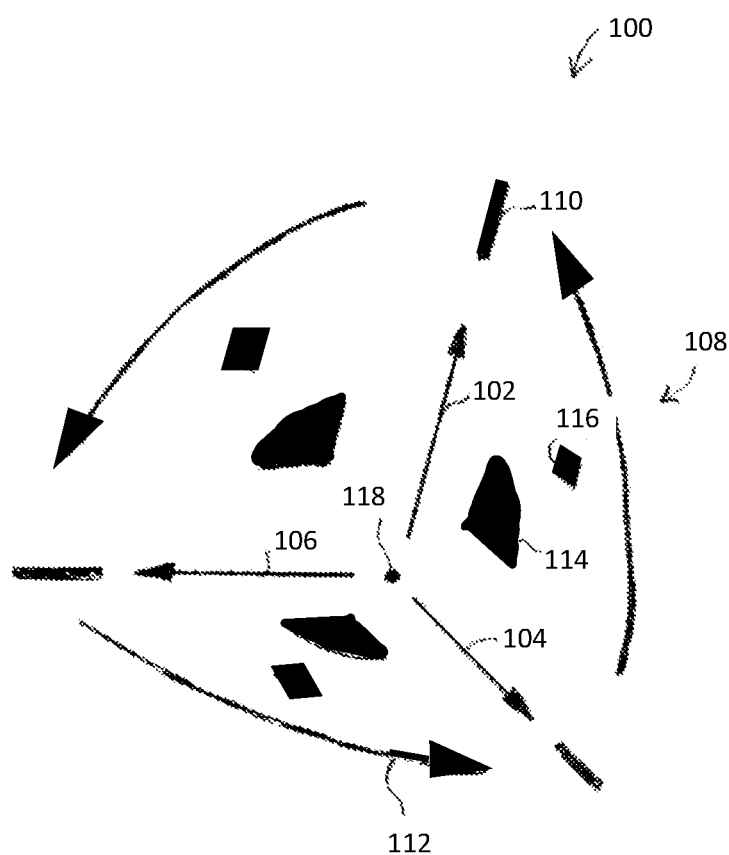
FIG. 1 is a perspective view of one embodiment of a graphic manipulator.

With reference now to FIG. 1, a perspective view of one embodiment of a graphic manipulator 100 is shown. The graphic manipulator 100 can be displayed in a variety of sizes and with a variety of resolutions so long as the features of the graphic manipulator 100 are distinguishable.

The graphic manipulator 100 can comprise a first axis indicator 102, a second axis indicator 104, and a third axis indicator 106. The axis indicators 102, 104, 106 can share a common origin and can be mutually perpendicular. The axis indicators 102, 104, 106 can comprise a variety of shapes, sizes, and colors. In the embodiment depicted in FIG. 1, the axis indicators 102, 104, 106 can comprise arrows having a tale proximal to the common origin and a head distal from the common origin.

In some embodiments, the axis indicators 102, 104, 106 can be configured to indicate and/or designate the axes of the object with which the graphic manipulator 100 is associated. In some embodiments, for example, the graphic manipulator 100 can be positioned relative to the object such that the axis indicators 102, 104, 106 are parallel and coaxial to the axes of the object, and in some embodiments, the graphic manipulator 100 can be positioned relative to the object such that the axis indicators 102, 104, 106 are parallel to the axes of the object. In some embodiments, each of the axis indicators 102, 104, 106 can be uniquely associated with one of the axes of the object such that the orientation of the graphic manipulator 100 relative to the object remains constant regardless of the position, size, shape, and/or manipulation of the object.

The graphic manipulator 100 can comprise a plurality of action icons 108. The action icons 108 can comprise graphical features that allow user control of the manipulation of the object. In some embodiments, each of the action icons 108 can perform a unique manipulation on the object. This manipulation can be unique in that the combination of the type of manipulation and the axis, plane, and/or planes about which, along which, or in which the manipulation occurs is unique. In some embodiments, the action icon can perform manipulation on the entire object and/or on the selected feature and/or portion of the object. In some embodiments, although a manipulation is specified for the selected feature and/or portion of the object, the manipulation can result in changes to non-selected portions and/or features of the object.

In some embodiments, an action icon 108 can manipulate the object by receiving a selection of a feature of the object and/or associated with the object for manipulation, by receiving a selection of the action icon 108 for performing a manipulation, by and receiving inputs directing the desired manipulation. In some embodiments, for example, the feature of the object and/or associated with the object can be selected by a user. In some embodiments, the selection can be made with, for example, a touch screen, a keyboard, a keypad, a mouse, a pointer, a track ball, a track pad, a microphone, a camera, and/or any other desired input feature and/or component. The selection can affect the display and availability of action icons 108 based on, for example, geometric characteristics of the selected object and/or feature. Thus, in some embodiments, one or several action icons 108 may not be available, and thus may not be displayed, if the one or several action icons 108 correspond to a manipulation conflicting with the geometric characteristics of the selected object and/or feature. In some embodiments, one or several action items 108 may not be available, and thus may not be displayed if the manipulation performed by the one or several action icons 108 is redundant to an allowable manipulation performed by another action icon.

In some embodiments, the action icons 108 can comprise a first visual state and a second visual state. In some embodiments, the first and second visual states can be visually distinct. In some embodiments, these visual states can correspond to a state of the action icon 108 such as, for example, a selected state and an unselected state. In some embodiments, for example, when an action icon 108 is selected for performing a manipulation, the display of the action icon 108 can change from the first visual state to the second visual state to thereby allow the user to see that the action icon 108 has been selected.

In some embodiments, the action icons 108 can comprise an icon configured to allow the object to be moved along one of the axes of the object. In some embodiments, for example, an action icon can be associated with each of the axes of the object to allow the control of movement along the associated axis. In the embodiment depicted in FIG. 1, the action icons 108 for controlling movement of the object along the axis of the object are the axis indicators 102, 104, 106.

The action icons 108 can comprise an icon configured to scale the object in one axis. In some embodiments, an icon configured to scale the object in one axis can be associated with each of the axes of the object. In the embodiment depicted in FIG. 1, the scale-in-one-axis action icon 110 allows scaling of the object in the axis indicated by first axis indicator 102. Although not specified, a similar action icon 108 is associated with each of the second and third axis indicators 104, 106.

The action icons 108 can comprise an icon configured to rotate the object about an axis. In the embodiment shown in FIG. 1, the rotate action icon 112 controls rotation of the object about the axis indicated by first axis indicator 102. Although not specified, a similar action icon 108 is associated with each of the second and third axis indicators 104, 106 shown in FIG. 1.

The action icons 108 can comprise an icon that control scaling of the object within a plane extending through two of the axis indicators. This icon can be used to control the size of the object and/or the selected feature within the plane defined by the two relevant axis indicators. In the embodiment depicted in FIG. 1, the scale-in-one-plane action icon 114 controls the size of the object and/or the selected feature and/or portion of the object within the plane defined by the first axis indicator 102 and the second axis indicator 104. Although not specified, a similar action icon 108 can be associated with the planes defined by the first and third axis indicators 102, 106 and the second and third axis indicators 104, 106.

The action icons 108 can comprise an icon that controls the movement and/or position of the object within one of the planes. This icon can be used to move the object and/or to change the position of the object. In the embodiment depicted in FIG. 1, the move-in-plane action icon 116 controls the position and/or movement of the object within the plane defined by the first and second axis indicators 102, 104. Although not specified, a similar action icon 108 can be associated with the planes defined by the first and third axis indicators 102, 106 and the second and third axis indicators 104, 106.

The action icons 108 can comprise an icon that scales the object and/or the selected feature of the object to control the size of the object and/or the selected feature of the object in all planes and/or along all axes. This icon can be used to scale the object and/or the selected feature of the object to a larger and/or smaller size. In the embodiment depicted in FIG. 1, the scale all action icon 118, located at the origin of the first, second, and third axis indicators 102, 104, 106 controls the scaling of the object and/or of the selected feature of the object in all planes and/or along all axes.

In some embodiments, the action icons 108 can comprise further icons configured to perform further functions. In one embodiment, for example, the action icons 108 can comprise an icon configured to control the movement and/or position of the entire object. This action icon 108 can be located at any desired location in the graphic manipulator 100.

Figure 2:
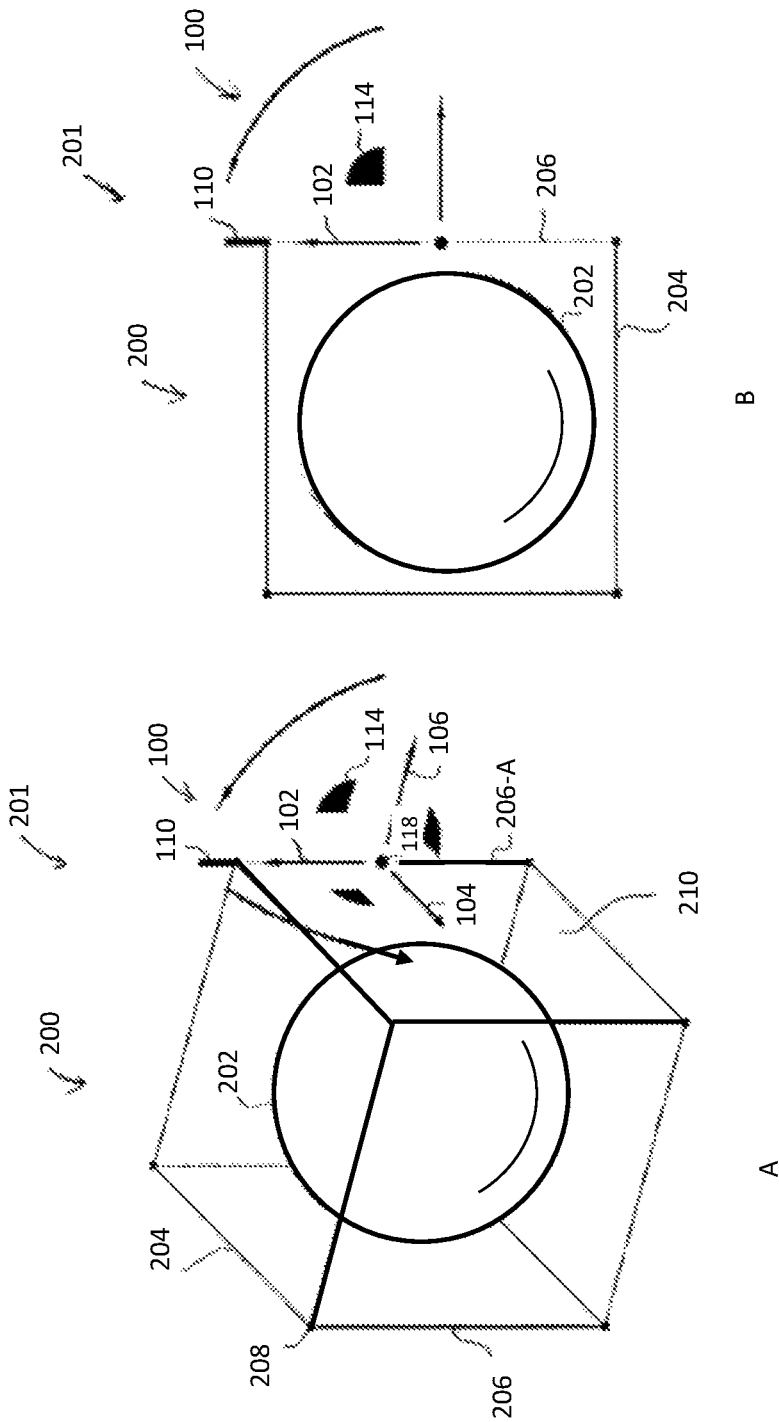
FIG. 2 depicts one embodiment of the graphic manipulator applied to an edge of the control mesh.

With reference now to FIG. 2, one embodiment of an application of the graphic manipulator is shown. As seen in FIG. 1, view A, the graphic manipulator 100 including the first axis indicator 102, the scale-in-one-axis action icon 110, the scaling plane action icon 114, and the scale all action icon 118 is shown in connection with the object system 200. In some embodiments, the combination of the graphic manipulator 100 and the object system 200 is referred to as the graphic manipulation system 201.

As seen in FIG. 2, view A, the object system 200 comprises the object 202. The object 202 can be a representation and/or rendering, that can be, for example, 2-D or 3-D, of a real, imagined, and/or virtual item. The object system 200 further comprises control mesh 204. The control mesh 204 forms a structure around all or portions of the object 202. The control mesh 204 can comprise a variety of shapes and sizes. In the embodiment depicted in FIG. 2, view A, the control mesh 204 comprises a prismatic set of geometries that extends around the entire object 202.

In some embodiments, the control mesh 204 can provide features and/or portions additional to those of the object 202 that can be used in connection with the action icons 108 to control the manipulation of the object 202. Specifically, the control mesh 204 depicted in FIG. 2, view A includes a plurality of edges 206, a plurality of vertices 208, and a plurality of faces 210. In the specific depicted embodiment, the control mesh 204 comprises 12 edges 206, eight vertices 208, and six faces 210. These features of the control mesh 204 can be selected to, in connection with the action icon 108, control an aspect of the object 202.

Similar to the action icons 108, the object 202, the features and/or portions of the object 202, the control mesh 204, and/or the features and/or portions of the control mesh 204 can have a first visual state and a second visual state. In some embodiments, the first visual state can correspond to an unselected state and the second visual state can correspond to a selected visual state. These distinct visual states can allow a user to distinguish and determine when the object 202 or portion thereof and/or control mesh 204 or portion thereof is selected or is not selected.

In some embodiments, the placement of the graphic manipulator 100 can be affected by the selection of the object 202, the control mesh 204, the portion of the object 202, or the portion of the control mesh 204. As specifically depicted in FIG. 2, edge 206-A has been selected. Due to the selection, the first axis indicator 102 of the graphic manipulator 100 is positioned with a vertical axis parallel to edge 206-A, and, in this embodiment, the vertical axis is specifically positioned parallel and coaxial to edge 206-A.

As seen in FIG. 2, the rotate action icon 112 of the graphic manipulator 100 is not displayed. As further seen in FIG. 2, the scale-in-one-axis action icons associated with the second and third axis indicators 104, 106, as well as the move in plane action icons 116 are not displayed. With specific reference to FIG. 2, view B, as the second axis indicator 104 is perpendicular to the viewing plane, the second axis indicator 104 is also not shown.

Figure 3:
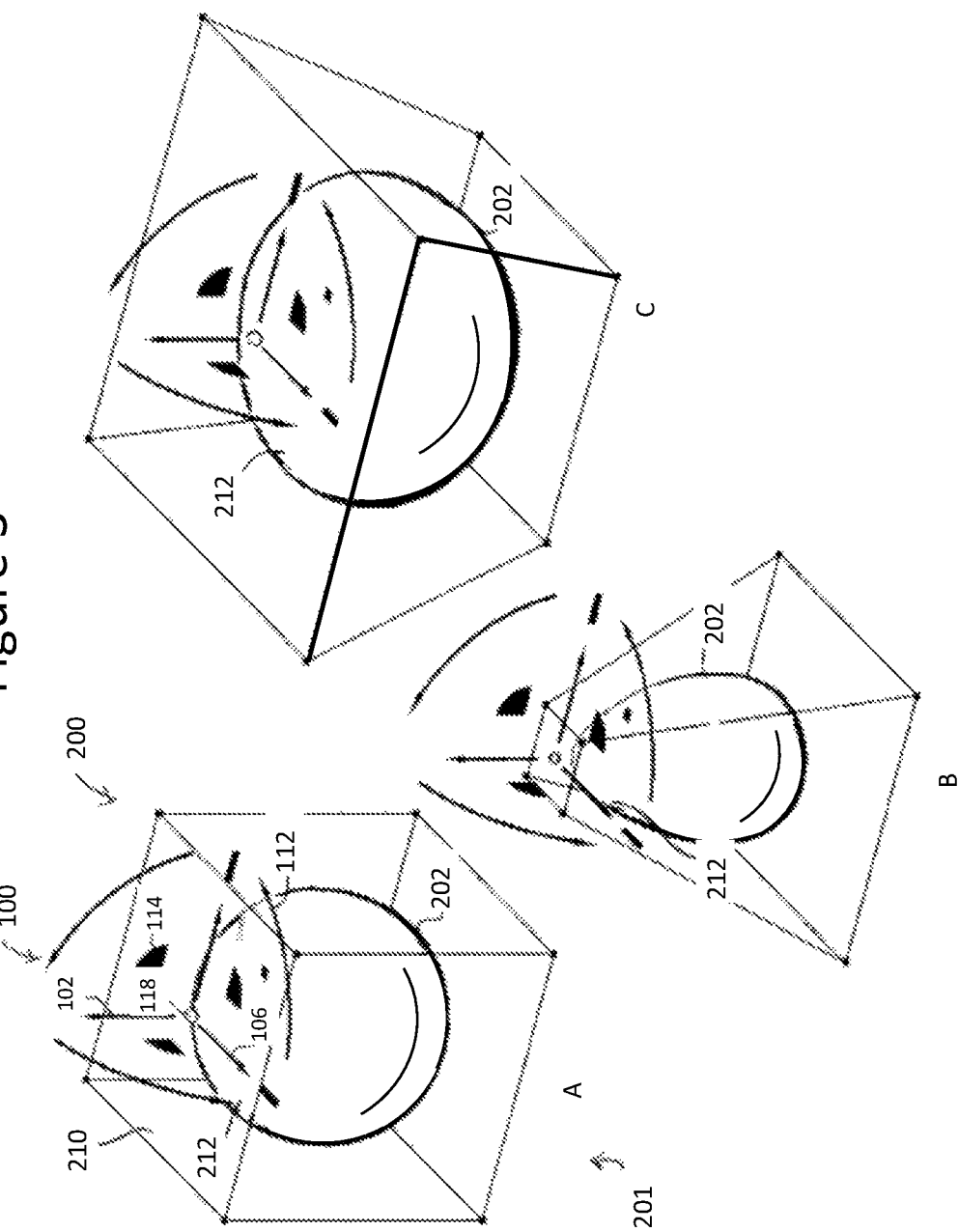
FIG. 3 depicts one embodiment of the graphic manipulator applied to a face of an object.

With reference now to FIG. 3, one embodiment of the application of the graphic manipulator 102 to the object system 200 is shown. As seen in FIG. 3, view A, the graphic manipulator 100 is applied to a face 212 of the object 202. In some embodiments, the face 212 of the object 202 can be selected by selection of the face 210 of the control mesh 204 and/or by direct selection of the face 212 of the object 202. As further seen in FIG. 3, the scale-in-one-axis action icon 110, the moving plane action icon 116, and the moving plane action icon associated with the plane defined by the first and third axis indicators 102, 106 are not shown.

In the embodiment depicted in FIG. 3, the face 212 of the control mesh has been selected. In addition, the scale all action icon 118 of the manipulator 100 has been selected. As further seen in FIG. 3, the scale all action icon 118 is depicted in a second visual state indicative of selection. This second state is indicated by the lack of fill of the scale all action icon 118, the lack of fill giving the scale all action icon 118 a lighter appearance. FIG. 3 further depicts the effect of the scale all action icon 118 in the different views. Thus, as seen in the comparison of view A to view B, the face 212 of the object 202 has been scaled to a smaller size, and as seen in the comparison of view A to view C, the face 212 of the object 202 has been scaled to a larger size.

Figure 4:
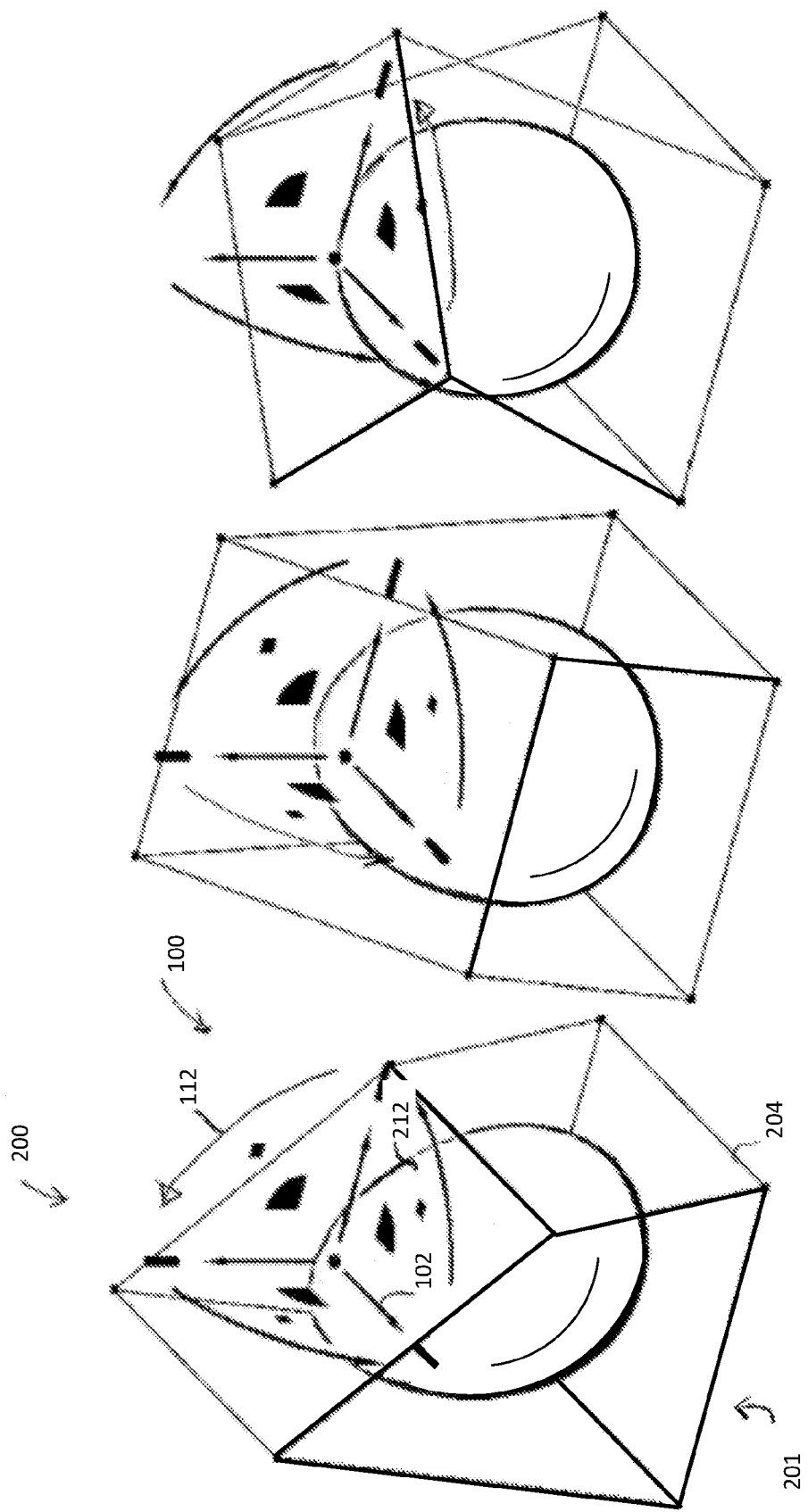
FIG. 4 depicts another embodiment of the graphic manipulator applied to a face of an object.

With reference now to FIG. 4, another embodiment of the application of the graphic manipulator 100 to face 212 of the object system 200 is shown. As seen in the embodiment depicted in FIG. 4, all of the action icons 108 of the graphic manipulator 100 are shown. In the embodiment depicted in FIG. 4, the rotate action icons associated with the first, second, and third axis indicators 102, 104, 106, are selected and used to rotate the face 212 of the object 202 about one of the first, second, and third axis indicators 102, 104, 106. The rotation of the face 212 and the effect on object 202 is evident in the changing shape of the face 212 and the object 202, and also in the changing shape of the control mesh 204 of the object system 200.

Figure 5:
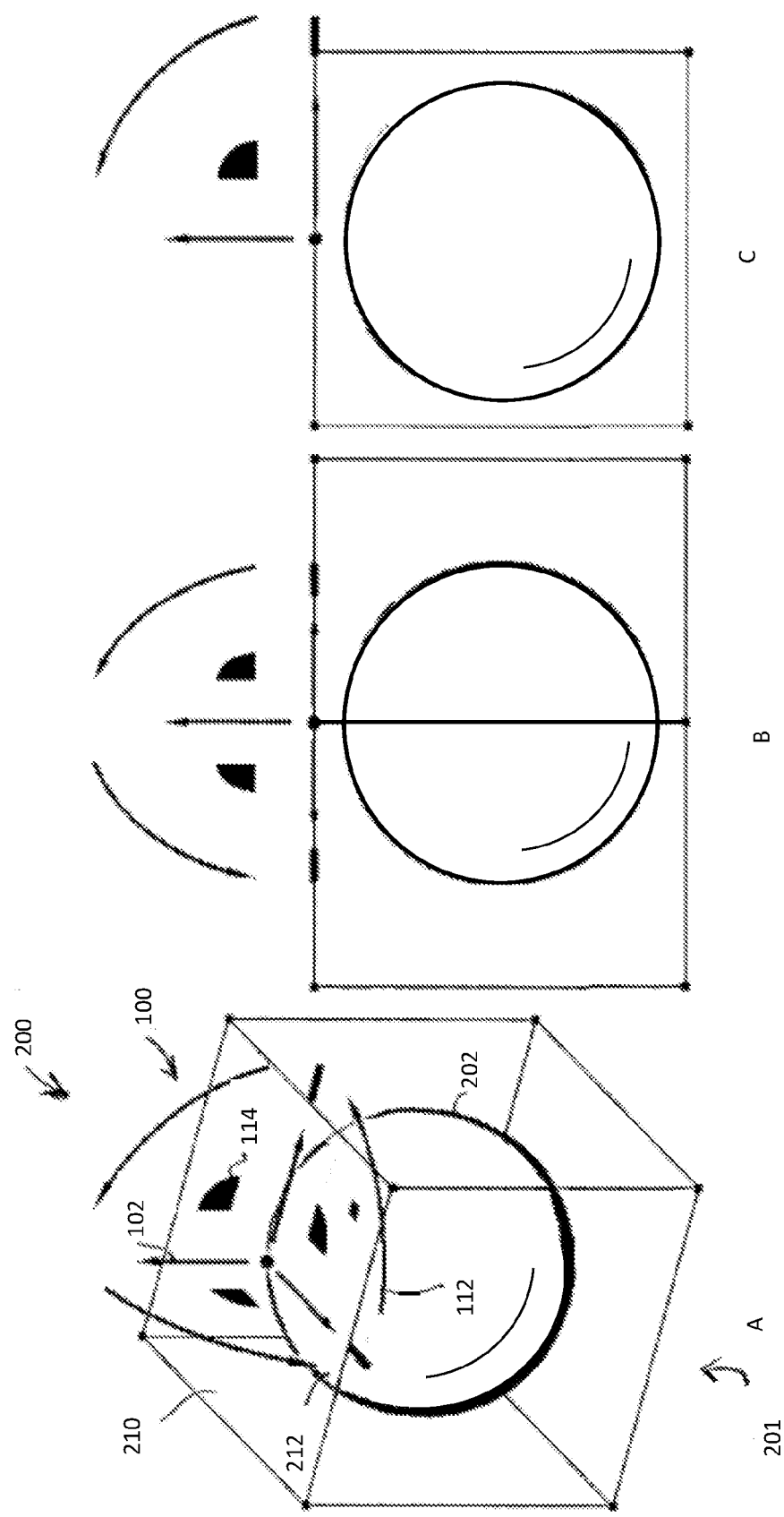
FIG. 5 depicts a series of views showing the placement of the graphic manipulator relative to a selected face of an object.

With reference now to FIG. 5, views indicating the placement of the graphic manipulator 100 relative to the object 202 and the control mesh 204 are shown. As seen in these views, the face 212 of the object 202 is selected, and, as a result of the selection of face 212, the graphic manipulator 100 is positioned so as to be centered above the selected face 212 of the object 202 and on top of the face 210 of the control mesh 204 which is located directly above, and adjacent to, the face 212 of the object 202. In addition, as a result of the selection of face 212, the graphic manipulator 100 is oriented such that 2 axes are within the plane defined by face 212, and the third axis is particular to face 212. As seen in FIG. 5, views B and C, action icons 108 in the plane perpendicular to the viewing plane are not displayed. In some embodiments, it can be determined if one of the planes defined by the graphic manipulator 100 is perpendicular to the viewing plane by calculating the normal vector of the viewing plane and the normal vectors of the planes defined by the graphic manipulator 100. The direction of these calculated normal vectors can then be compared to determine if one of the planes defined by the graphic manipulator 100 is perpendicular to his substantially particular to the viewing plane. In some embodiments, the viewing plane can comprise an imaginary plane located between the display device and/or projector and the user. In some embodiments in which the display device and/or projector has a planar display and/or projection surface, the viewing plane can comprise that planar surface of the display device.

In some embodiments, the graphic manipulator 100 can be configured to measure the angle between the planes defined by the axis indicators 102, 104, 106 and a viewing plane of the image, and if one of the planes defined by the axis indicators 102, 104, 106 is substantially perpendicular to or is within a specified angle of being perpendicular to the viewing plane, to hide the action icons 108 in that plane. As further seen in FIG. 5, view C, only two of the axis indicators are shown as the third axis indicator is perpendicular to the viewing plane, and is therefore hidden.

Method of Providing Graphic Manipulator

Figure 6:
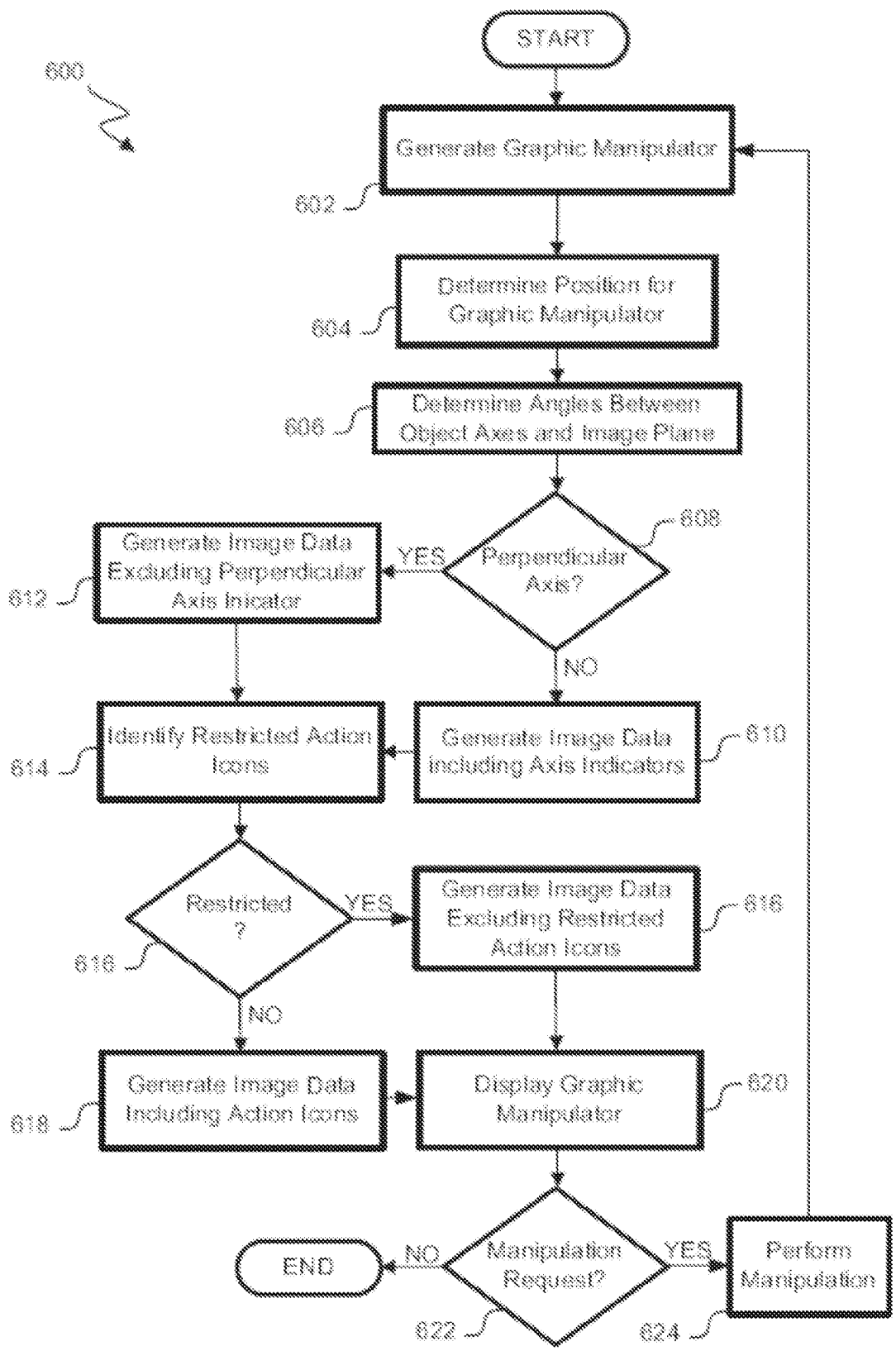
FIG. 6 is a flow chart illustrating one embodiment of a method of providing a graphic manipulator.

With reference now to FIG. 6, a flowchart illustrating one embodiment of a process 600 for providing the graphic manipulator 100 is shown. In some embodiments, this process 600 can be performed by computer and/or processor acting according to instructions stored in memory associated with the computer and/or processor.

The process 600 begins at block 602 where the graphic manipulator 100 is generated. In some embodiments, the generation of the graphic manipulator can include the creation of image data for the graphic manipulator and/or the creation of image data for the graphic manipulation system 201. In some embodiments, the graphic manipulator 100 is generated in response to selection of a geometry of a control mesh 204 associated with a graphical object 202.

After the graphic manipulator 100 is generated, the process 600 proceeds to block 604 wherein the position for the graphic manipulator 100 is determined. In some embodiments, this determination can include determining the location of the axes of the object 202, determining the location and orientation of a selected one or more geometries of the object 202 and/or control mesh 204, and determining the orientation of the axes of the object 202 with respect to the viewing plane. In some embodiments, the determination of the orientation the axes of the object 202 with respect to the viewing plane can include determining the direction of extension of the axis indicators 102, 104, 106 such that the axis indicators 102, 104, 106 appear to extend out from the viewing plane regardless of the orientation of their associated axes.

After the position for the graphic manipulator 600 has been determined, the process 600 proceeds to block 606 wherein the angles between the axes of the object 202 and the viewing plane are determined. In some embodiments, this can include calculating the normal vector of the viewing plane and determining the difference between the direction of the normal vector of the viewing plane and the axes of the object 202. After the angles between the object axes and the viewing plane are determined, the process 600 proceeds to decision state 608 wherein it is determined whether the axes of the object 202 are perpendicular to the viewing plane. If it is determined that the axes of the object 202 are non-perpendicular with the viewing plane, then the process proceeds to block 610 wherein image data including the axis indicators is generated. Returning again to decision state 608, if it is determined that one of the axes of the object 202 is perpendicular to the viewing plane, then the process 600 proceeds to block 612 wherein image data excluding the perpendicular axis indicator is generated.

After the image data has been generated in blocks 610, 612, the process 600 proceeds to block 614 wherein restricted action icons 108 are identified. In some embodiments, a restricted action icon 108 can include an action icon 108 that is not displayed in the image as a result of the action icon 108 being in a plane that is perpendicular with the viewing plane, as a result of the action icon 108 being not operative on the selected control mesh 204, object 202, or geometry, as a result of the action icon 108 performing a redundant action, and/or for any other desired reason. In some embodiments, after a restricted action icon 108 has been identified, an indicator of the restriction can be associated with the action icon 108. In some embodiments, this indicator can be added to a database of information relating to the graphic manipulator 100, the object system 200, and/or the graphic manipulation system 201.

After the identification of restricted action icons 108 is made, the process 600 proceeds to decision state 616 wherein it is determined whether there are any restricted action icons 108. In some embodiments, this determination can include retrieving any restriction indicators from, for example, the database.

If it is determined that there are restricted action icons 108, then the process 600 proceeds to block 616 wherein image data excluding restricted action icons 108 is generated. In some embodiments, this data can be a modification of the image data generated in blocks 610, 612, an addition to the image data generated in blocks 610, 612, and/or a replacement of image data generated in blocks 610, 612.

If it is determined that there are no restricted action icons 108, then the process 600 proceeds to block 618 wherein image data including all action icons 108 is generated. In some embodiments, this data can be a modification of the image data generated in blocks 610, 612, an addition to the image data generated in blocks 610, 612, and/or a replacement of image data generated in blocks 610, 612.

After the image data has been generated in blocks 616 or 618, the process 600 proceeds to block 620, wherein the graphic manipulator is displayed. In some embodiments the display of the graphic manipulator 100 can include the display of, for example, the graphic manipulation system 201, the object system 200, the object 202, the control mesh 204, and/or the graphic manipulator 100. In some embodiments, the display of the graphic manipulator 100 can comprise the conversion of the generated image data into an image, and the display of the generated image on, for example, a screen, a monitor, a television, a display, and/or the projection of the image.

After the graphic manipulator 100 has been displayed, the process 600 proceeds to decision state 622 wherein it is determined whether a manipulation request has been received. In some embodiments, a manipulation request can comprise a user request to manipulate the object 202 via, for example, the graphic manipulator 100. If a manipulation request has been received, the process 600 proceeds to block 624 wherein the manipulation is performed, and then returns to block 602. If it is determined that a manipulation request has not been received, then the process 600 can optionally terminate.

Figure 7:
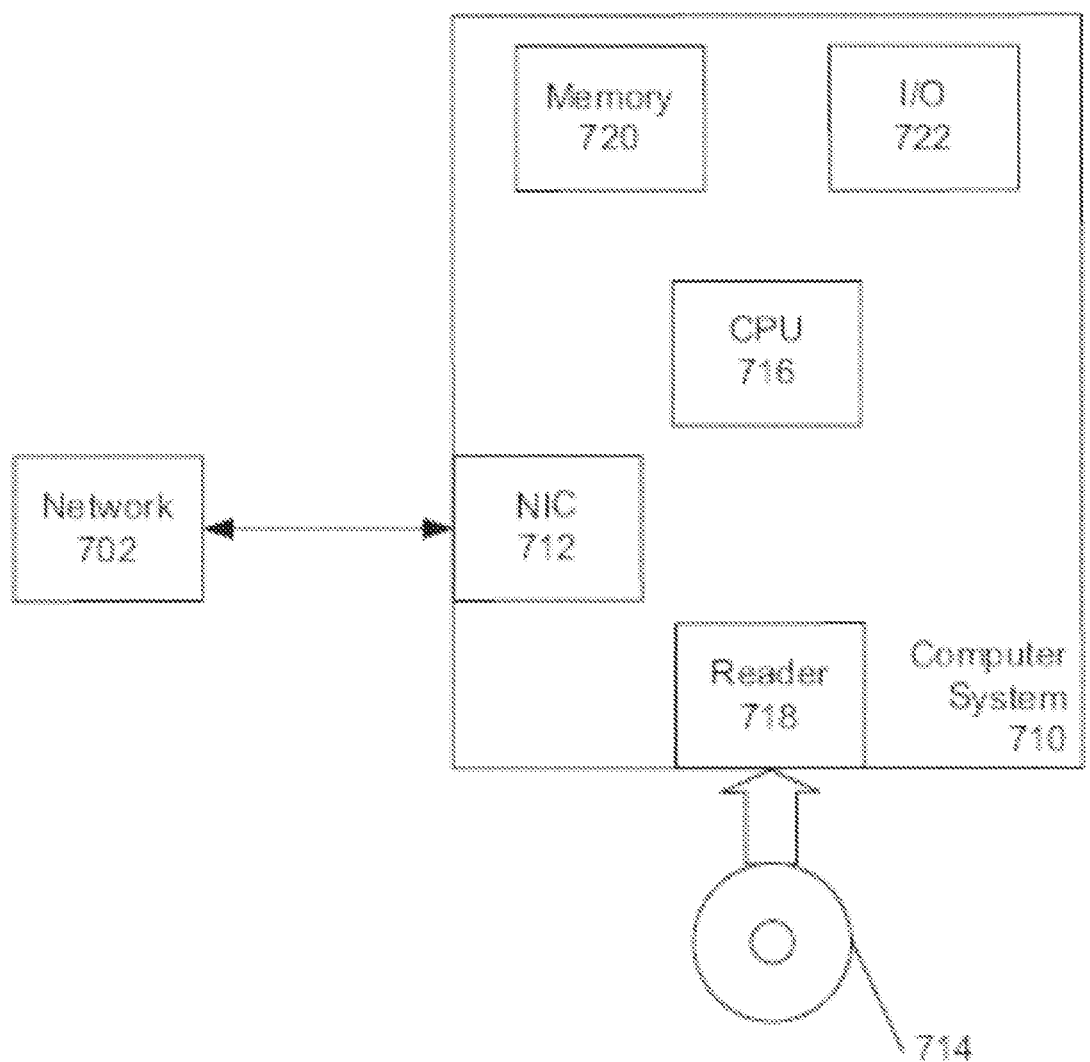
FIG. 7 shows a configuration of a computer system constructed in accordance with the present disclosure.

With reference now to FIG. 7, a configuration for a computer system 710 constructed in accordance with the present disclosure to perform the operations disclosed herein is shown. The computer system 710 can comprise a system such as a personal computer or server computer or the like. The computer system 710 may include a network communication interface 712 that permits communications with a network 702. The network interface can comprise a network interface card (NIC). The computer system 710 can execute instructions to provide a computer system which performs various aspects and principles of the methods and features described herein. For example, each of the components of FIGS. 1-6 may be implemented by one or more of the computer systems 710.

The computer system 710 includes a central processor unit 716 (CPU) and a program product reader 718 for receiving a program product media and reading program instructions recorded thereon, where the instructions, when executed by the computer cause the computer to perform various aspects and principles of the methods and features described herein. The computer system also includes associated memory 720 and input/output facilities 722, such as a display for output and a keyboard and/or mouse for input. The processor 716 of the computer system 710 can receive program instructions into the program memory of the processor. The program instructions can be received directly, such as by flashing EEPROM of the processor, or can be received through the network interface 712, such as by download from a connected device or over a WAN or LAN network communication. If desired, the program instructions can be stored on a computer program product 714 that is read by the computer system 710 so that the program instructions can thereafter executed. That is, the program product 714 is for use in a system such as the computer system 710, wherein the program product comprises a tangible, non-transitory recordable media containing a program of computer-readable instructions that are executable by the device processor 704 to perform the operations described herein. The program product 714 can comprise, for example, optical program media such as CD or DVD data discs, or flash memory drives, or external memory stores, or floppy magnetic disks, and the like.

A number of variations and modifications of the disclosed embodiments can also be used. Specific details are given in the above description to provide a thorough understanding of the embodiments. However, it is understood that the embodiments may be practiced without these specific details. For example, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above, and/or a combination thereof.

Also, it is noted that the embodiments may be described as a process which is depicted as a flowchart, a flow diagram, a swim diagram, a data flow diagram, a structure diagram, or a block diagram. Although a depiction may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, scripting languages, firmware, middleware, microcode, hardware description languages, and/or any combination thereof. When implemented in software, firmware, middleware, scripting language, and/or microcode, the program code or code segments to perform the necessary tasks may be stored in a machine readable medium such as a storage medium. A code segment or machine-executable instruction may represent a procedure, a function, a subprogram, a program, a routine, a subroutine, a module, a software package, a script, a class, or any combination of instructions, data structures, and/or program statements. A code segment may be coupled to another code segment or a hardware circuit by passing and/or receiving information, data, arguments, parameters, and/or memory contents. Information, arguments, parameters, data, etc. may be passed, forwarded, or transmitted via any suitable means including memory sharing, message passing, token passing, network transmission, etc.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory. Memory may be implemented within the processor or external to the processor. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" may represent one or more memories for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, and/or various other storage mediums capable of storing that contain or carry instruction(s) and/or data.

While the principles of the disclosure have been described above in connection with specific apparatuses and methods, it is to be clearly understood that this description is made only by way of example and not as limitation on the scope of the disclosure.

What is claimed is:

1. A method of providing a graphic manipulating tool on a display of a computer system, the method comprising:

generating a graphic manipulator configured to control the position of an object displayed on the display and associated with the graphic manipulator, the graphic manipulator comprising:

a first axis indicator, wherein the first axis indicator comprises a first axis movement action icon configured to control the position of the object associated with the graphic manipulator along the axis identified by the first axis indicator;

a second axis indicator extending perpendicular to the first axis indicator, wherein the second axis indicator comprises a second axis movement action icon configured to control the position of the object along the axis identified by the second axis indicator;

a third axis indicator extending perpendicular to the first and second axis indicators, wherein the third axis indicator comprises a third axis movement action icon configured to control the position of the object along the axis identified by the third axis indicator, wherein a first plane extends through the first and second axis indicators, a second plane extends through the second and third axis indicators, and a third plane extends through the third and first axis indicators;

a first scale-in-one-axis action icon configured to control the size of the object along the axis identified by the first axis indicator;

a second scale-in-one-axis action icon configured to control the size of the object along the axis identified by the second axis indicator;

a third scale-in-one-axis action icon configured to control the size of the object along the axis identified by the third axis indicator;

a first rotate action icon configured to control the rotation of the object about the axis identified by the first axis indicator;

a second rotate action icon configured to control the rotation of the object about the axis identified by the second axis indicator;

a third rotate action icon configured to control the rotation of the object about the axis identified by the third axis indicator;

a first plane scale action icon configured to control the size of the object parallel to the first plane;

a second plane scale action icon configured to control the size of the object parallel to the second plane;

a third plane scale action icon configured to control the size of the object parallel to the third plane;

a first plane move action icon configured to control the position of the object parallel to the first plane;

a second plane move action icon configured to control the position of the object parallel to the second plane;

a third plane move action icon configured to control the position of the object parallel to the third plane;

generating an image comprising the graphic manipulator and the object; and displaying the image of the graphic manipulator and the object on the display;

receiving a request via the first axis movement action icon to modify the position of the object along the first axis, moving the object along the first axis, and displaying the object in a different position along the first axis;

receiving a request via the second axis movement action icon to modify the position of the object along the second axis, moving the object along the second axis, and displaying the object in a different position along the second axis;

receiving a request via the third axis movement action icon to modify the position of the object along the third axis, moving the object along the third axis, and displaying the object in a different position along the third axis;

receiving a request via the first scale-in-one action icon to modify the size of the object along the first axis, modifying the size of the object along the first axis, and displaying the object with a different size along the first axis;

receiving a request via the second scale-in-one action icon to modify the size of the object along the second axis, modifying the size of the object along the second axis, and displaying the object with a different size along the second axis;

receiving a request via the third scale-in-one action icon to modify the size of the object along the third axis, modifying the size of the object along the third axis, and displaying the object with a different size along the third axis;

receiving a request via the first rotate action icon to modify the orientation of the object along the first axis, modifying the orientation of the object along the first axis, and displaying the object with a different orientation along the first axis;

receiving a request via the second rotate action icon to modify the orientation of the object along the second axis, modifying the orientation of the object along the second axis, and displaying the object with a different orientation along the second axis;

receiving a request via the third rotate action icon to modify the orientation of the object along the third axis, modifying the orientation of the object along the third axis, and displaying the object with a different orientation along the third axis;

receiving a request via the first plane scale action icon to modify the size of the object parallel to the first plane, modifying the size of the object parallel to the first plane, and displaying the object with a different size parallel to the first plane;

receiving a request via the second plane scale action icon to modify the size of the object parallel to the second plane, modifying the size of the object parallel to the second plane, and displaying the object with a different size parallel to the second plane;

receiving a request via the third plane scale action icon to modify the size of the object parallel to the third plane, modifying the size of the object parallel to the third plane, and displaying the object with a different size parallel to the third plane;

receiving a request via the first plane move action icon to modify the position of the object parallel to the first plane, modifying the position of the object parallel to the first plane, and displaying the object with a different size parallel to the first plane;

receiving a request via the second plane move action icon to modify the position of the object parallel to the second plane, modifying the position of the object parallel to the second plane, and displaying the object with a different size parallel to the second plane; and receiving a request via the third plane move action icon to modify the position of the object parallel to the third plane, modifying the position of the object parallel to the third plane, and displaying the object with a different size parallel to the third plane.

2. The method of claim 1, wherein the graphic manipulator further comprises a scale all action icon located at a junction of the axes indicated by the first, second, and third axis indicators, wherein the scale all action item controls the size of the object along the three axes identified by the first, second, and third axis indicators.

3. The method of claim 1, wherein generating the image further comprises determining one or more action icons or axis indicators to be restricted, restricting the one or more action icons or axis indicators determined to be restricted, and generating image data for action items and axis indicators which are not restricted.

4. The method of claim 3, wherein the one or more action items to be restricted are determined based on whether an action associated with the one or more action icons is available.

5. The method of claim 3, wherein the one or more action items to be restricted are determined based on whether the one or more action or axis indicators icons is within a specified angle of being perpendicular to a viewing plane for displaying the image.

6. The method of claim 1, wherein the image is generated such that pairing of the viewing plane and each of the first, second, and third axis indicators defines a non-perpendicular angle.

7. A computer system with a screen configured to display a graphical user interface, wherein the graphical user interface is configured to:

generate a graphic manipulator configured to control the position of an object displayed on the display and associated with the graphic manipulator, the graphic manipulator comprising:

a first axis indicator, wherein the first axis indicator comprises a first axis movement action icon configured to control the position of the object associated with the graphic manipulator along the axis identified by the first axis indicator;

a second axis indicator extending perpendicular to the first axis indicator, wherein the second axis indicator comprises a second axis movement action icon configured to control the position of the object along the axis identified by the second axis indicator;

a third axis indicator extending perpendicular to the first and second axis indicators, wherein the third axis indicator comprises a third axis movement action icon configured to control the position of the object along the axis identified by the third axis indicator, wherein a first plane extends through the first and second axis indicators, a second plane extends through the second and third axis indicators, and a third plane extends through the third and first axis indicators;

a first scale-in-one-axis action icon configured to control the size of the object along the axis identified by the first axis indicator;

a second scale-in-one-axis action icon configured to control the size of the object along the axis identified by the second axis indicator;

a third scale-in-one-axis action icon configured to control the size of the object along the axis identified by the third axis indicator;

a first rotate action icon configured to control the rotation of the object about the axis identified by the first axis indicator;

a second rotate action icon configured to control the rotation of the object about the axis identified by the second axis indicator;

a third rotate action icon configured to control the rotation of the object about the axis identified by the third axis indicator;

a first plane scale action icon configured to control the size of the object parallel to the first plane;
a second plane scale action icon configured to control the size of the object parallel to the second plane;
a third plane scale action icon configured to control the size of the object parallel to the third plane;
a first plane move action icon configured to control the position of the object parallel to the first plane;
a second plane move action icon configured to control the position of the object parallel to the second plane;
a third plane move action icon configured to control the position of the object parallel to the third plane;
generate an image comprising the graphic manipulator and the object; and
display the image of the graphic manipulator and the object on the display;
receive a request via the first axis movement action icon to modify the position of the object along the first axis, move the object along the first axis, and display the object in a different position along the first axis;
receive a request via the second axis movement action icon to modify the position of the object along the second axis, move the object along the second axis, and display the object in a different position along the second axis;
receive a request via the third axis movement action icon to modify the position of the object along the third axis, move the object along the third axis, and display the object in a different position along the third axis;
receive a request via the first scale-in-one action icon to modify the size of the object along the first axis, modify the size of the object along the first axis, and display the object with a different size along the first axis;
receive a request via the second scale-in-one action icon to modify the size of the object along the second axis, modify the size of the object along the second axis, and display the object with a different size along the second axis;
receive a request via the third scale-in-one action icon to modify the size of the object along the third axis, modify the size of the object along the third axis, and display the object with a different size along the third axis;
receive a request via the first rotate action icon to modify the orientation of the object along the first axis, modify the orientation of the object along the first axis, and display the object with a different orientation along the first axis;
receive a request via the second rotate action icon to modify the orientation of the object along the second axis, modify the orientation of the object along the second axis, and display the object with a different orientation along the second axis;
receive a request via the third rotate action icon to modify the orientation of the object along the third axis, modify the orientation of the object along the third axis, and display the object with a different orientation along the third axis;
receive a request via the first plane scale action icon to modify the size of the object parallel to the first plane, modify the size of the object parallel to the first plane, and display the object with a different size parallel to the first plane;
receive a request via the second plane scale action icon to modify the size of the object parallel to the second plane, modify the size of the object parallel to the second plane, and display the object with a different size parallel to the second plane;
receive a request via the third plane scale action icon to modify the size of the object parallel to the third plane, modify the size of the object parallel to the third plane, and display the object with a different size parallel to the third plane;
receive a request via the first plane move action icon to modify the position of the object parallel to the first plane, modify the position of the object parallel to the first plane, and display the object with a different size parallel to the first plane;
receive a request via the second plane move action icon to modify the position of the object parallel to the second plane, modify the position of the object parallel to the second plane, and display the object with a different size parallel to the second plane; and
receive a request via the third plane move action icon to modify the position of the object parallel to the third plane, modify the position of the object parallel to the third plane, and display the object with a different size parallel to the third plane.

8. The computer system of claim 7, further comprising receiving a request to manipulate the object via the selection and movement of one of the following action icons:
a scale-in-one-axis action icon;
a rotate action icon;
a plane scale action icon; and
a plane move action icon.

9. A non-transitory computer-readable medium having a plurality of instructions stored therein, the plurality of instructions being configured to, when executed by a processor, cause a computer system to:
access data defining an image of an object configured to be displayed in a viewing plane, the object comprising:
a first axis extending from an object origin,
a second axis extending from the object origin,
a third axis extending from the object origin,
wherein the axes are mutually perpendicular;
access data defining an image of a graphic manipulator configured to be displayed with the object in the viewing plane, the graphic manipulator comprising:
a first axis indicator extending in a first single direction from a manipulator origin and parallel to the first axis of the object,
a second axis indicator extending in a second single direction from the manipulator origin and parallel to the second axis of the object, and
a third axis indicator extending in a third single direction from the manipulator origin and parallel to the third axis of the object,
wherein the axis indicators are configured to appear to extend out from the viewing plane regardless of the orientation of their associated object axes;
wherein the first axis indicator comprises a first axis movement action icon configured to control the position of the object associated with the graphic manipulator along the axis identified by the first axis indicator;
wherein the second axis indicator comprises a second axis movement action icon configured to control the position of the object along the axis identified by the second axis indicator;
wherein the third axis indicator comprises a third axis movement action icon configured to control the position of the object along the axis identified by the third axis indicator, wherein the first axis indicator comprises a first axis movement action icon configured to control the position of the object associated with the graphic manipulator along the axis identified by the first axis indicator;

a second axis indicator extending perpendicular to the first axis indicator, wherein the second axis indicator comprises a second axis movement action icon configured to control the position of the object along the axis identified by the second axis indicator;

a third axis indicator extending perpendicular to the first and second axis indicators, wherein the third axis indicator comprises a third axis movement action icon configured to control the position of the object along the axis identified by the third axis indicator, wherein a first plane extends through the first and second axis indicators, a second plane extends through the second and third axis indicators, and a third plane extends through the third and first axis indicators;

a first scale-in-one-axis action icon configured to control the size of the object along the axis identified by the first axis indicator;

a second scale-in-one-axis action icon configured to control the size of the object along the axis identified by the second axis indicator;

a third scale-in-one-axis action icon configured to control the size of the object along the axis identified by the third axis indicator;

a first rotate action icon configured to control the rotation of the object about the axis identified by the first axis indicator;

a second rotate action icon configured to control the rotation of the object about the axis identified by the second axis indicator;

a third rotate action icon configured to control the rotation of the object about the axis identified by the third axis indicator;

a first plane scale action icon configured to control the size of the object parallel to the first plane;

a second plane scale action icon configured to control the size of the object parallel to the second plane;

a third plane scale action icon configured to control the size of the object parallel to the third plane;

a first plane move action icon configured to control the position of the object parallel to the first plane;

a second plane move action icon configured to control the position of the object parallel to the second plane;

a third plane move action icon configured to control the position of the object parallel to the third plane;

display, on the display, the image of the object and the image of the graphic manipulator based on the object data and the graphic manipulator data;

receive a request via the first axis movement action icon to modify the position of the object along the first axis, move the object along the first axis, and display the object in a different position along the first axis;

receive a request via the second axis movement action icon to modify the position of the object along the second axis, move the object along the second axis, and display the object in a different position along the second axis;

receive a request via the third axis movement action icon to modify the position of the object along the third axis, move the object along the third axis, and display the object in a different position along the third axis;

receive a request via the first scale-in-one action icon to modify the size of the object along the first axis, modify the size of the object along the first axis, and display the object with a different size along the first axis;

receive a request via the second scale-in-one action icon to modify the size of the object along the second axis, modify the size of the object along the second axis, and display the object with a different size along the second axis;

receive a request via the third scale-in-one action icon to modify the size of the object along the third axis, modify the size of the object along the third axis, and display the object with a different size along the third axis;

receive a request via the first rotate action icon to modify the orientation of the object along the first axis, modify the orientation of the object along the first axis, and display the object with a different orientation along the first axis;

receive a request via the second rotate action icon to modify the orientation of the object along the second axis, modify the orientation of the object along the second axis, and display the object with a different orientation along the second axis;

receive a request via the third rotate action icon to modify the orientation of the object along the third axis, modify the orientation of the object along the third axis, and display the object with a different orientation along the third axis;

receive a request via the first plane scale action icon to modify the size of the object parallel to the first plane, modify the size of the object parallel to the first plane, and display the object with a different size parallel to the first plane;

receive a request via the second plane scale action icon to modify the size of the object parallel to the second plane, modify the size of the object parallel to the second plane, and display the object with a different size parallel to the second plane;

receive a request via the third plane scale action icon to modify the size of the object parallel to the third plane, modify the size of the object parallel to the third plane, and display the object with a different size parallel to the third plane;

receive a request via the first plane move action icon to modify the position of the object parallel to the first plane, modify the position of the object parallel to the first plane, and display the object with a different size parallel to the first plane;

receive a request via the second plane move action icon to modify the position of the object parallel to the second plane, modify the position of the object parallel to the second plane, and display the object with a different size parallel to the second plane; and receive a request via the third plane move action icon to modify the position of the object parallel to the third plane, modify the position of the object parallel to the third plane, and display the object with a different size parallel to the third plane.

10. The non-transitory computer-readable medium of claim 9, wherein the graphic manipulator further comprises a plurality of action icons, each associated with one or more of the axis indicators, and wherein the action icons are configured to control at least one of the size, the orientation, and the shape of the object.

11. The non-transitory computer-readable medium of claim 10, wherein the image further comprises a control mesh.

12. The non-transitory computer-readable medium of claim 11 further comprising:
- receive a selection of a portion of the object or the control mesh;
- receive request to alter at least one of the size, the orientation, and the shape of the object via one of the action icons; and
- display an image of the object altered according to the request in the viewing plane.

13. The non-transitory computer-readable medium of claim 12, wherein the appearance of the one action icon is altered to provide a visual indication of a selection of the one action icon.

14. The non-transitory computer-readable medium of claim 9 further comprising:
- determine an angle between each of the axes and the viewing plane; and
- update the image of the graphic manipulator to not include any axis indicator associated with an axis having an angle different by less than a threshold from 90 degrees.

* * * * *